United States Patent [19]
DeHaven

[11] Patent Number: 5,515,218
[45] Date of Patent: May 7, 1996

[54] GROUND FAULT CIRCUIT INTERRUPTER, CIRCUIT, CIRCUIT TESTER AND METHOD

[76] Inventor: Jeff L. DeHaven, P.O. Box 51043, Pacific Grove, Calif. 93950

[21] Appl. No.: 131,713

[22] Filed: Oct. 5, 1993

[51] Int. Cl.$^6$ ............................................. H02H 3/16
[52] U.S. Cl. ................... 361/45; 361/49; 324/510
[58] Field of Search ........................ 361/45, 46, 49, 361/50; 324/523, 522, 531, 555, 510

[56] References Cited

U.S. PATENT DOCUMENTS

| | | | |
|---|---|---|---|
| 4,816,957 | 3/1989 | Irwin | 361/45 |
| 4,979,070 | 12/1990 | Bodkin | 361/42 |
| 5,302,905 | 4/1994 | Crick | 324/613 |
| 5,363,047 | 11/1994 | Dresti et al. | 324/510 |

*Primary Examiner*—Todd DeBoer
*Attorney, Agent, or Firm*—Lundy and Associates

[57] ABSTRACT

A circuit tester comprising a ground fault circuit interrupter having two pair of leads connected to opposite sides of the interrupter in series for connecting the ground fault interrupter between an electrical circuit and a power source to indicate current leakage in an amount greater than about 0.005 amperes, a method for utilizing the circuit tester for detecting amperage leakage in the circuit, and an electrical circuit which will be interrupted whenever there is ampere leakage above that magnitude.

15 Claims, 2 Drawing Sheets

GROUND FAULT CIRCUIT INTERRUPTER, CIRCUIT, CIRCUIT TESTER AND METHOD

BACKGROUND OF THE INVENTION

The present invention pertains to electrical circuits and circuit testers, and more particularly to circuits with ground fault circuit interrupters, circuit testers and methods for testing electrical circuits.

The modern electrical home has a plurality of circuits connected to a circuit box which is in turn connected to the line voltage. The National Electrical ode ("NEC") requires all such circuits to be protected from shorts by a circuit overload device such as a fuse or a circuit breaker. In recent years, the NEC required each circuit to be grounded and to have three-prong outlets. However, homes built prior to 1973 were not required by the NEC to have these grounded circuits, and most of those pre-1973 buildings are equipped with two-prong outlets and ungrounded electrical circuits.

Such electrical circuits, under certain circumstances, can cause severe shocks or even electrocution. As circuit overload devices, such as fuses and circuit breakers, only isolate a circuit from the line voltage at an appreciable number of amperes, the danger of electrocution and shock is always present in such circuits even when grounded. Circuit breakers will not detect low level current leakage under the breaker rating, i.e., under about 15 amperes, will not detect a faulty appliance, will not detect a neutral wire grounded to cold water piping downstream of the electrical panel, will not detect expose wiring, will not detect outlets and appliances in which the ground wire and the hot wire are reversed, will not detect more than one breaker feeding a circuit, will not detect a ground wire sharing more than one circuit, and will not detect circuits not grounded at the panel. All of these problems can occur in any building.

Whenever a person touches an appliance under a situation in which a battery ground is provided through the person, the current leakage will occur through the person, not through the ground wire and cause a shock. Whether or not the shock is safe or unsafe depends upon the amperage leaked through the person. Such shocks below five milliamperes are harmless. Five milliamperes is approximately the shock felt from static electricity in the carpet. Five to eight milliamperes, a severe shock sensation will occur. Eight to fifteen milliamperes, a painful shock that could result in death may occur. Fifteen to twenty milliamperes affects muscle control and the person being shocked cannot extricate himself from the circuit. Over 200 milliamperes, severe burns and heart failure occurs.

It is therefore highly desirable to provide an improved circuit using ground fault circuit interrupters which are resetable, on/off switches which will shut off upon sensing any current leakage in a circuit measuring more than 0.005 milliamperes in 1/40 of a second.

While ground fault circuit interrupters have been available since 1973, their use is still being explored. The 1990 edition of the NEC requires only limited ground fault interrupter protection for circuits in new construction in such areas as the kitchen, bath, garage, laundry, and outdoors. Ground fault interrupter code requirements are primarily for shock safety.

The 1993 NEC still does not require all circuits to be protected by ground fault circuit interrupters. Thus, many buildings have circuits which are unprotected by ground fault interrupters. Many of those circuits may leak current at dangerous levels. Ground fault interrupters also have a plurality of uses not heretofore realized.

It is therefore highly desirable to provide an improved circuit tester and method for testing circuits.

It is also highly desirable to provide an improved circuit tester and method for testing circuits to determine current leakage in amounts above 0.005 amperes.

It is also highly desirable to provide an improved circuit tester and method for testing circuits which detects not only current leakage, but approximate location that the current leakage is occurring such that the leakage can be repaired.

It is also highly desirable to provide an improved circuit tester and method which requires a minimum of knowledge by the operator such that it can be conveniently utilized by a building owner or handyman and not require trained electricians or electrical engineers.

It is also highly desirable to provide an improved circuit tester and method for testing circuits which is simple and inexpensive to manufacture.

It is also highly desirable to provide an improved circuit tester and method for testing circuits which is consistent with the NEC.

It is also highly desirable to provide an improved circuit with a ground fault circuit interrupter for new construction.

Finally, it is highly desirable to provide an improved circuit tester and method for testing circuits and an improved circuit which include all of the above features.

SUMMARY OF THE INVENTION

It is therefore an object of the invention to provide an improved circuit tester and method for testing circuits.

It is also an object of the invention to provide an improved circuit tester and method for testing circuits to determine current leakage in amounts above about 0.005 amperes.

It is also an object of the invention to provide an improved circuit tester and method for testing circuits which detects not only current leakage, but approximate location that the current leakage is occurring such that the leakage can be repaired.

It is also an object of the invention to provide an improved circuit tester and method which requires a minimum of knowledge by the operator such that it can be conveniently utilized by a building owner or handyman and not require trained electricians or electrical engineers.

It is also an object of the invention to provide an improved circuit tester and method for testing circuits which is simple and inexpensive to manufacture.

It is also an object of the invention to provide an improved circuit tester and method for testing circuits which is consistent with the NEC.

It is also an object of the invention to provide an improved circuit with a ground fault circuit interrupter for new construction.

Finally, it is an object of the invention to provide an improved circuit tester and method for testing circuits and an improved circuit which include all of the above features.

In the broader aspects of the invention, there is provided a circuit tester comprising a ground fault circuit interrupter having two pair of leads connected to opposite sides of the interrupter in series for connecting the ground fault interrupter between an electrical circuit and a powered source to indicate current leakage in an amount greater than about 0.005 amperes, a method for utilizing the circuit tester for detecting amperage leakage in the circuit, and an electrical circuit which will be interrupted whenever there is ampere leakage above that magnitude.

BRIEF DESCRIPTION OF THE DRAWINGS

The above-mentioned and other features and objects of the invention and the manner of attaining them will become more apparent and the invention itself will be better understood by reference to the following description of an embodiment of the inveniton taken in conjunction with the accompanying drawings wherein:

FIG. 3 is a diagrammatical illustration showing a conventional circuit for illustrating the improved method of the invention.

FIG. 4 is an illustration like FIG. 3 showing one embodiment of the improved circuit of the invention.

DESCRIPTION OF A SPECIFIC EMBODIMENT

The invention provides an improved method of testing electrical circuits 10 utilizing the circuit tester 12 of the invention. By the method, all existing electrical circuits 10 no matter how old can be tested.

Figure 2:
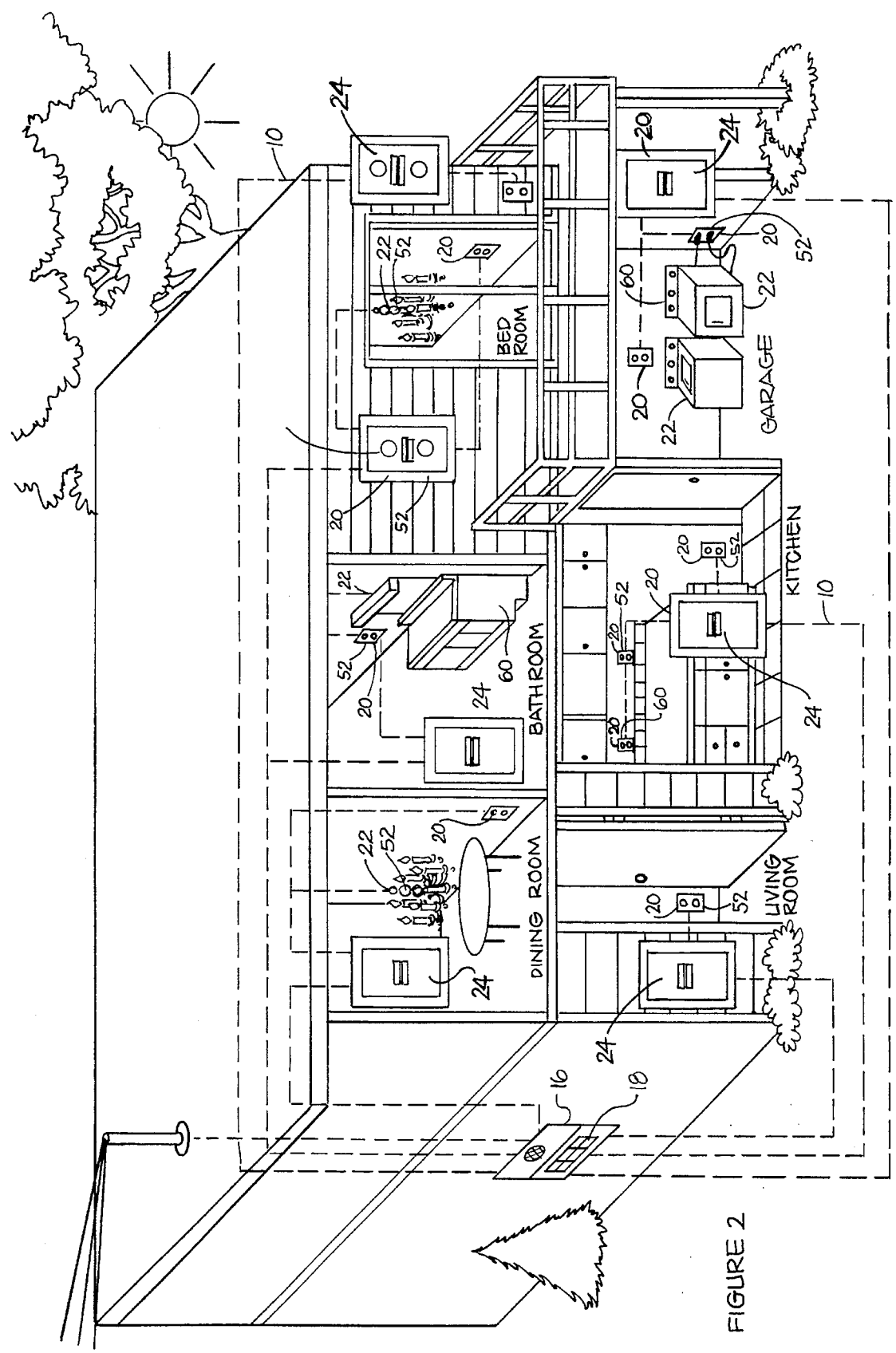
FIG. 2 is a diagrammatical illustration of a home having a plurality of ground fault circuit interrupter circuits of the invention.

Prior to 1973, most electrical circuits 10 in existing buildings were connected to the line voltage 14 at a junction box 16 through electrical overload devices 18, such as fuses or circuit breakers. The electrical outlet or junction box 16 is usually located in the basement of the building an connected directly to the line voltage from connections outside of the building. From the junction box 16 and the circuit overload devices 18, circuits 10 which extend to a plurality of electrical sockets 20 or appliances 22 are commonplace. Certain electrical appliances 22 such as lights, telephones, garage door openers, furnaces, music systems, and the like may be directly wired into a part of the circuit 10. Other electrical appliances 22 are only connected to the circuit 10 through electrical outlet sockets 20 placed in the walls of various rooms of the building. FIG. 2 diagrammatically illustrates a home with the circuit of the invention in two embodiments, as will be explained hereinafter.

These appliances 22 and circuits 10 may be faulty for a number of reasons. Appliance leakage in which current continually leaks from the appliance 22 to ground, frayed cords, hazardous wiring in the building or the lack of a ground are known. Neutral wires are grounded downstream from the junction box 16, insulated wires have insulation removed exposing the conductors, load lines and ground lines may be reversed, neutral wires may share more than one load line from different overload devices 18, and ground lines not connected or broken all cause faulty circuits 10.

Furthermore, the aging of installed wiring can cause similar problems. Many wire insulations exhibit cracking because of variations in humidity, dry climates, dust and sunlight, ad temperature extremes. Wire insulation can be damaged by drawing multiple wires through narrowly bored holes and joists, compressing wires in framed walls, ceilings, and roof rafters, by contact with sharp edges on heating ducts, door jambs, and metal cross bars, by contact with construction materials, such as plaster, lathing, nails, staples, and the like, or by an electrician's stripping errors or wiring defects.

Any appliance 22 can become faulty during use and leak current to ground whenever in use. Some appliances 22 are permanently connected to a circuit 10 such as washing machines, furnaces, dishwashers, refrigerators, and the like. Others are only removably connected to a circuit 10 by an outlet 20. All appliances 22, when faulty, can continuously leak current to ground. Each of these appliances 22 are unsafe to a person using those appliances 22.

All of these circuit defects can be detected by the method of the invention utilized with the circuit tester 12 of the invention in accordance with the following method.

Figure 1:
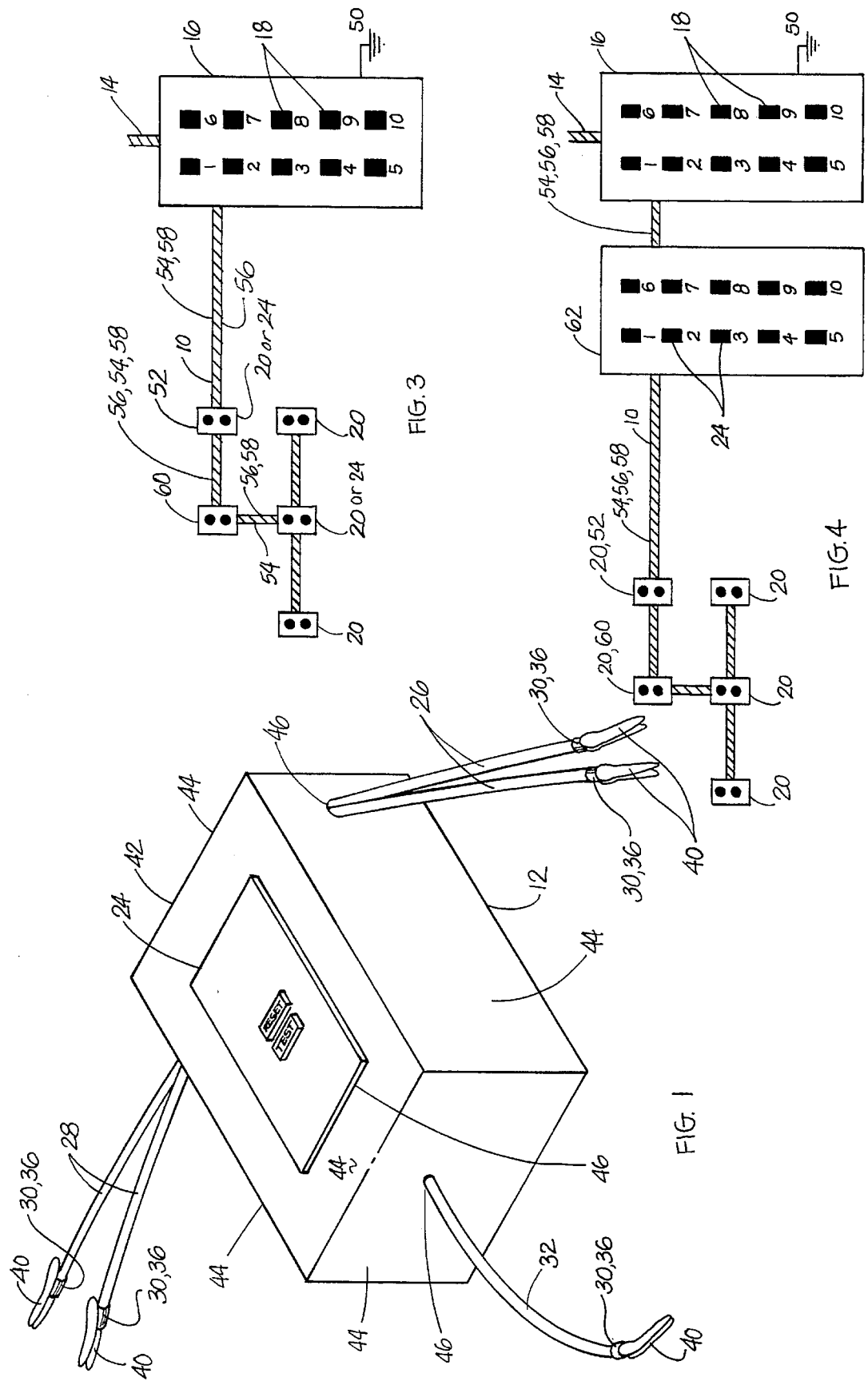
FIG. 1 is a perspective view of the improved circuit tester of the invention.

A circuit tester 12 comprising a ground fault circuit interrupter 24 is provided. As illustrated in FIG. 1, this ground fault circuit interrupter 24 is provided with two pair 26, 28 of electrical leads having opposite ends 30. The leads 26, 28 are connected to opposite sides of the interrupter 24 in series. A fifth lead 32 is connected between the ground fault circuit interrupter 24 and ground 34. The other lead ends 30 are distal ends 36. The distal ends 36 are equipped with removable connectors 40 as illustrated, or voltage probes or any means by which he distal ends 36 may be removably connected to a circuit 10.

The ground fault interrupter 24 of the circuit tester 12 of the invention is used to test the circuit 10 by depressing the test button. When circuit tester 12 is properly installed between the load and line voltage and ground an existing circuit 10 may be tested as follows. When the test button is depressed, the reset button should pop out. When the test button has been depressed, all of the appliances 22 and outlets 20 between the circuit tester 12 and the end of the circuit should be dead. This can be verified by plugging in a lamp or lightbulb tester or the equivalent to the circuit tester 12 and to the outlet 20, 22 between the circuit tester 12 and the end of the circuit.

Similarly, the power should be restored to all of the appliances and outlets between the circuit tester and the end of the circuit when the reset button of the ground fault circuit interrupter of the circuit tester is depressed. When the reset button is depressed, the test button should pop out.

In a specific embodiment, the ground fault circuit interrupter 24 may be mounted in a box 42 having openings 46 in a side wall 44 of the box 42 as shown in FIG. 1, the ground fault interrupter 24 being within the box 42. The leads 30 extend through one or more openings 46 in another side wall 44 of the box 42. The distal ends 36 are outside of the box 42 and have removable connectors 40 secured thereto or are otherwise adapted to be connected to be between the load and line sides of an electrical circuit 10 and a ground 50 to indicate current leakage in an amount greater than about 0.005 milliamperes in the method of the invention as follows.

In order to test an existing circuit 10 for faults by the method of the invention, a circuit 10 is identified. The line voltage 14 to the circuit 10 is turned off at the overload device 18. Each of the outlets 20 of the circuit 10 are identified with a lightbulb tester or an equivalent device. A portable table lamp carried from outlet to outlet would suffice as an equivalent device. All dead appliances 22 are also identified. Those outlets 20 and appliances 22 that belong to the circuit 10 are dead or have no power.

The first outlet 20 or appliance 22 in a circuit 10 is next identified. This is accomplished by disconnecting from the circuit 10 an outlet 20 in close proximity to the overload device 18. The power or line voltage 14 is turned back on and each of the outlets 20 and appliances 22 identified in the circuit 10 are re-checked. If the first outlet 20 or appliance 22 in the circuit 10 has been disconnected or is dead, all of the other outlets 20 and appliances 22 will be dead.

If all of the other outlets 20 and appliances 22 are not dead, the line voltage 14 is turned off at the overload device 18, the outlet 20 or appliance 22 previously disconnected is reconnected to the circuit 10 and another outlet 20 or appliance 22 in close proximity to the junction box or panel 16 is disconnected as the possible first outlet 20 in the circuit 10. The power is turned back on, and all of the outlets 20 and appliances 22 in the circuit 10 are re-checked. Again, if you have located the first outlet 20 in the circuit 10, all of the other outlets 20 and appliances 22 in the circuit 10 will be dead. These steps are repeated until the first outlet 52 in the circuit 10 is found.

The circuit tester 12 is then connected to the circuit 10 at the first outlet 52. The line voltage 14 is turned off. The leads 54, 56, 58 are unhooked from the outlet 20. The load leads 54 and the line leads 56 are tested for line voltage 14 with a volt meter by connecting a volt meter between each of the leads 54, 56 and the ground lead 58. The ground lead 58 is also tested if present, or if no ground lead 58 is present, an insulated wire is connected to a nearby water pipe and each of the leads 54, 56 are tested again. If the test with the ground lead 58 in outlet 20 and the test with the insulated wire connected to a water pipe are the same, the ground lead 58 present is satisfactory.

Turn the power off at the overload device 18 again, and you are ready to connect the circuit tester 12 to the circuit 10. The circuit tester 12 is connected to the circuit 10 by connecting the first pair of leads 26 to the load bearing leads 54, connecting the second pair of leads 28 to the line bearing leads 56, and connecting the ground lead 32 to the ground lead 58. The power is turned back on. If the ground fault circuit interrupter 24 will not reset, the circuit 10 is faulty. If the ground fault interrupter 24 will reset, the circuit 10 from the overload device 18 to the last outlet 20 or appliance 22 is fault free and in working order.

If the ground fault circuit interrupter 24 of the circuit tester 12 will not reset, the location of the problem in the circuit 10 can be determined by finding the second 60 and subsequent outlets and appliances 20, 22.

The second outlet or appliance 60 in circuit 10 is identified by disconnecting from the circuit 10 another outlet 20 in close proximity to the overload device 18. The line voltage 14 is turned back on and each of the outlets 20 and appliances 22 identified in the circuit 10 are re-checked. After the second outlet or appliance 60 in the circuit 10 has been disconnected, only the first outlet 52 will have power and all of the other outlets 20 and appliances 22 will be dead. If all of the other outlets 20 and appliances 22 are not dead, the power 14 is turned off at the overload device 18, and the outlet or appliance is reconnected to the circuit 10 and another outlet 20 or appliance 22 in close proximity to the junction box 16 is disconnected. The line voltage 14 is turned back on, and all of the outlets 20 and appliances 22 in the circuit 10 are re-checked. Again, if you have located the second outlet 60 in the circuit 10, all of the other outlets 20 and appliances 22 in the circuit 10 except for the first outlet 52 will be dead. These steps are repeated until the second outlet 60 in circuit 10 is found.

The circuit tester 12 is then connected to the circuit 10 at the second outlet 60. The line voltage 14 is turned off. The leads are unhooked from the outlet. The load leads 54 and line leads 56 are tested for line voltage 14 with a volt meter by connecting a volt meter between each of the leads 54, 56 and the ground lead 58. Test the ground lead 58 again, or if no ground is present, connect an insulated wire to a nearby water pipe and test each of the leads 54, 56 again. If the test with the ground lead 58 and the test with the insulated wire connected to a water pipe are the same, the ground lead 58 present is satisfactory.

Turn the power off at the overload device 18 again and you are ready to connect the circuit tester 24 to the circuit 10. The circuit tester 24 is connected to the circuit 10 by connecting the first pair of leads 26 to the load bearing leads 54, connecting the second pair of leads 28 to the line bearing leads 56, and connecting the ground lead 32 to the ground lead 58. The power is turned back on. If the ground fault cicuit interrupter will not reset, the circuit is faulty further out. If the ground fault interrupter will reset, any fault previously identified in the circuit 10 is located between the first and second outlet and the remainder of the circuit 10 is in working order.

If the ground fault circuit interrupter of the circuit tester will not reset, the location of the problem in the circuit can be determined by finding the third outlet, etc., and the steps outlined above are repeated until the circuit 10 is "checked out," and all faults are located.

Whenever the ground fault circuit interrupter of the circuit tester will not reset, then the fault in the circuit is located between the last tested outlet or appliance and the most distant outlet or appliance from the circuit breaker and the above steps are repeated. Whenever the ground fault circuit interrupter of the circuit tester will reset, the fault in the circuit is located between the last tested outlet or appliance and the previously tested outlet or appliance, and the remainder of the circuit is fault free.

When a fault is determined in a circuit, and located by the above method, the fault is repaired and the circuit is retested utilizing the circuit tester at the first outlet or appliance in the circuit as above described to insure that the circuit does not have more than one fault. If the ground fault circuit interrupter of the circuit tester resets when connected at the first outlet or appliance, then circuit 10 is fault free.

The improved electrical circuit 10 of the invention is an electrical circuit in which one or more of the electrical outlet sockets 20 are replaced with a ground fault circuit interrupter 24. The preferred improved electrical circuit 10 of the invention is a circuit 10 in which the first appliance or electrical outlet socket 20 and one of every few electrical outlet sockets 20 are replaced with ground fault circuit interrupters 24. Few means no more than five, and no less than two. In this manner, the entire circuit 10 can be periodically tested for faults and periodically circuit segments can be tested for faults. Further, the entire circuit 10 will be protected from power surges. The life of appliances will be extended, and the life of the wiring will be extended. The circuit will be protected against shock and most electrical fires. All of these advantages will be acquired by the improved electrical circuit 10 of the invention utilizing copper wire and extending from a single circuit breaker or fuse or other circuit overload device.

There are four kinds of ground fault circuit interrupters 24. There is the receptacle type and the circuit breaker type. There are also portable ground fault circuit interrupters that plug into an outlet 20 and are movable from outlet to outlet and cord type ground fault circuit interrupters which are used in the appliance load of certain appliances. Only the circuit breaker type and the receptacle type are usable as permanently installed components of the circuits 10 of the invention. The term "ground fault circuit interrupters," however, include all of these devices irrespective of their structure.

In addition to the improved electrical circuit 10 of the invention above described, the electrical circuit 10 of the invention may also utilize ground fault circuit interrupters 24 mounted in a junction box 62 adjacent junction box 16 between the overload devices 18 and the first outlet 20, 52 or appliance 22, 52. FIG. 4 shows this embodiment of the invention with all of the structure shown in FIG. 3 and a ground fault circuit interrupter box 62 adjacent box 16. In both FIGS. 3 and 4, only a single circuit 10 is illustrated, whereas it should be understood that separate circuits 10 exist for each of the overload devices 18 of box 16 illustrated and each of the ground fault circuit interrupters 24 of box 62 illustrated. Each of the circuits include load lines, line leads ad ground leads extending between the circuit overload devices 18 and the ground fault circuit interrupters 24 and between the ground fault circuit interrupters 24 and the outlets 20.

The circuit 10 of FIG. 3 shows the position of two of the outlets 20 which may be provided with a receptacle type ground fault circuit interrupter 24 mounted between load leads 56 and line leads 54. FIG. 4 illustrates ground circuit interrupters 24 of the circuit breaker type being mounted between load leads 56 and line leads 54, and in box 62 located between the overload devices 18 and outlets 20. Both embodiments of the improved circuit 10 illustrate the improved circuit of the invention.

While the above described test methods and circuit tester can be used in circuits which are both grounded and ungrounded, the above description described the circuit testing method of the invention utilizing a grounded circuit. If the circuit is ungrounded, the ground wire of the circuit tester is either connected to an insulated wire connected to a water pipe or other suitable ground, or the method is performed with the ground wire unconnected. Similarly, the improved electrical circuit of the invention is an improvement over conventional circuits whether ungrounded or grounded. The major difference between an ungrounded or grounded circuit 10 of the invention would be in the safe levels below 5 milliamperes. Rather than no shock at all with a grounded electrical circuit of the invention, the same circumstances wold produce shocks at safe levels in an ungrounded circuit.

The improved circuit of the invention, whether grounded or ungrounded, provides a circuit for new construction in which the circuit and/ or circuit segments can be periodically tested for faults. The circuit is protected from power surges, and the life of both appliances and wiring is extended. The improved circuit is protected against shock and most electrical fires. The improved circuit tester and method for testing circuits provides a tester and method to determine current leakage in amounts above about 0.005 amperes and the location of the current leakage. The improved circuit tester and method of the invention requires a minimum knowledge by the operator and can be conveniently utilized by building owners and handymen, and does not require trained electricians or electrical engineers. The improved circuit tester method is simple and inexpensive to manufacture and use, and is consistent with the NEC.

While a specific embodiment of the invention has been shown and described herein for purposes of illustration, the protection afforded by any patent which may issue upon this application is not strictly limited to the disclosed embodiment; but rather extends to all structures and arrangements which fall fairly within the scope of the claims which are appended hereto:

What is claimed is:

1. A circuit tester comprising a ground fault circuit interrupter having opposite line sides, opposite load sides and a ground terminal, said tester having a first pair of electrical leads having opposite ends, said tester having a second pair of leads having opposite ends, said tester having a ground lead having opposite ends, said leads of said first pair being connected to opposite load sides of said interrupter in series at one lead end, said leads of said second pair being connected to opposite line sides of said interrupter in series at one lead end, said ground lead being connected to said ground terminal of said interrupter at one lead end, said other of said lead ends of the first pair, second pair and ground lead being distal ends.

2. The circuit tester of claim 1 wherein said distal ends have removable connectors secured thereto.

3. The circuit tester of claim 1 wherein said ground fault circuit interrupter is mounted on a side wall of a box having first, second, and third openings said ground fault circuit interrupter being within said box, said first pair of leads extending through said first opening, said second pair of leads extending through said second opening, said ground lead extending through said third opening, said distal ends being outside of said box.

4. The circuit tester of claim 1 wherein said distal ends of said first pair of leads are adapted to be removably connected to load leads of an electrical circuit, said distal ends of said second pair of leads being adapted to be connected to line leads of said circuit, said distal end of said ground lead being adapted to be connected to a ground between an electrical circuit and a power source to indicate current leakage in said circuit greater than about 0.005 amperes.

5. The circuit tester of claim 1 wherein said distal ends of said first pair of leads are adapted to be removably connected between load leads of an electrical circuit, said distal ends of said second pair of leads being adapted to be connected between line leads of said circuit, said distal end of said ground lead being unconnected.

6. A circuit tester comprising a ground fault circuit interrupter having opposite line sides, opposite load sides and a ground terminal, said tester having a first pair of electrical leads having oppoiste ends, said tester having a second pair of leads having oppoiste ends, said tester having a ground lead having opposite ends, said leads of said first pair being connected to opposite load sides of said interrupter in series at one lead end, said leads of said second pair being connected to opposite line sides of said interrupter in series at one lead end, said ground lead being connected to said ground terminal of said interrupter at one lead end, said other of said lead ends of the first pair, second pair and ground lead being distal ends, said ground fault interrupter is mounted on a side wall of a box having first, second, and third openings, said ground fault interrupter being within said box, said first pair of leads extending through said first opening, said second pair of leads extending through said second opening, said ground lead extending through said third opening, said distal ends being outside of said box, said distal ends have removable connectors secured thereto.

7. A method of testing an electrical circuit having a circuit overload device, several electrical outlets and at least one appliance connected in parallel outlets and at least one appliance connected in parallel comprising: defining said electrical outlet, appliance and said overload device of said circuit, determining the first electrical outlet of said circuit, and substituting a ground fault circuit interrupter for said first electrical outlet in parallel with said remaining electrical outlets and said overload device of said circuit to indicate current leakage in said circuit distal from said ground fault interrupter in amounts greater than about 0.005 amperes.

8. The method of claim 7 wherein said defining step includes isolating line voltage from said circuit at said circuit overload device.

9. The method of claim 7 wherein said defining step includes isolating line voltage from said circuit at said first electrical outlet, and noting that all other outlets are also isolated from said line voltage.

10. The method of claim 7 wherein said connecting step includes connecting a circuit tester to said circuit, said circuit tester having a ground fault circuit interrupter having opposite line sides, opposite load sides and a ground terminal, said tester having a first pair of electrical leads having opposite ends, said tester having a second pair of leads having opposite ends, said tester having a ground lead having opposite ends, said leads of said first pair being connected to opposite load sides of said interrupter in series at one lead end, said leads of said second pair being connected to opposite line sides of said interrupter in series at one lead end, said ground lead being connected to said ground terminal of said interrupter at one lead end, said other of said lead ends of the first pair, second pair and ground lead being distal ends, said distal ends of said first pair of leads are adapted to be removably connected to the load leads of an electrical circuit, said distal ends of said second pair of leads are adapted to be removably connected to said line leads of said circuit, said distal end of said ground lead is adapted to be removably connected to a ground between an electrical circuit and a power source to indicate current leakage in said circuit greater than about 0.005 amperes.

11. The method of claim 9 further comprising determining the next successive electrical outlet of said circuit, and substituting a ground fault circuit interrupter for said next successive electrical outlet of said circuit in parallel with any remaining electrical outlets and said overload device of said circuit to indicate current in said circuit distal from said ground fault interrupter in amounts greater than about 0.005 amperes and fault locations between said next successive electrical outlet and the last tested electrical outlet.

12. The method of claim 11 further comprising the step of retesting said circuit by substituting a ground fault circuit interrupter for said first electrical outlet in parallel to any remaining electrical outlets and said overload device at said first outlet, and by noticing that said ground faults have been located and corrected and said circuit is fault free.

13. The method of claim 12 wherein said substituting step includes connecting a circuit tester to said circuit, said circuit tester having a ground fault circuit interrupter having opposite line sides, opposite load sides and a ground terminal, said tester having a first pair of electrical leads having opposite ends, said tester having a second pair of leads having opposite ends, said tester having a ground lead having opposite ends, said leads of said first pair being connected to opposite load sides of said interrupter in series at one lead end, said leads of said second pair being connected to opposite line sides of said interrupter in series at one lead end, said ground lead being connected to said ground terminal of said interrupter at one lead end, said other of said lead ends of the first pair, second pair and ground lead being distal ends, said distal ends of said first pair of leads are adapted to be removably connected to the load leads of an electrical circuit, said distal ends of said second pair of leads are adapted to be removably connected to said line leads of sad circuit, said distal end of said ground lead is adapted to be removably connected to a ground between an electrical circuit and a power source to indicate current leakage in said circuit greater than about 0.005 amperes.

14. The method of claim 12 further comprising repeating said defining step guessing which of said circuit outlets may be the next successive outlet until the first outlet is determined.

15. An electrical circuit comprising a power source, a circuit overload device, a plurality of ground fault circuit interrupters and one or more electrical outlets connected in parallel, one ground fault circuit interrupter connected between said overload device and a first of said outlets, said overload device connected between said power source and said one ground fault circuit interrupter, and another ground fault circuit interrupter connected between said first of said outlets and another of said outlets.

\* \* \* \* \*